(12) United States Patent
Byron

(10) Patent No.: US 6,310,996 B1
(45) Date of Patent: Oct. 30, 2001

(54) WRITING BRAGG GRATINGS IN OPTICAL WAVEGUIDES

(75) Inventor: Kevin Christopher Byron, Herts (GB)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/015,675

(22) Filed: Jan. 29, 1998

(30) Foreign Application Priority Data

Sep. 22, 1997 (GB) .................................................. 9720135

(51) Int. Cl.$^7$ ...................................................... G02B 6/34
(52) U.S. Cl. .................................................................. 385/37
(58) Field of Search ............................................. 385/37, 10

(56) References Cited

U.S. PATENT DOCUMENTS

| | | |
|---|---|---|
| 4,474,427 | 10/1984 | Hill et al. . |
| 4,725,110 | 2/1988 | Glenn et al. . |
| 5,351,321 | 9/1994 | Snitzer et al. . |
| 5,636,304 * | 6/1997 | Mizrahi et al. ......................... 385/37 |
| 5,668,901 * | 9/1997 | Keck et al. ............................. 385/37 |
| 5,745,615 * | 4/1998 | Atkins et al. ........................... 385/37 |
| 5,748,814 * | 5/1998 | Painchaud et al. ..................... 385/37 |
| 5,837,169 * | 11/1998 | Rourke ................................... 385/10 |
| 5,867,618 * | 2/1999 | Ito et al. ................................. 385/37 |
| 5,881,186 * | 3/1999 | Starodubov ............................ 385/37 |
| 5,945,261 * | 8/1999 | Rourke ................................... 385/37 |
| 6,072,926 * | 6/2000 | Cole et al. .............................. 385/37 |

OTHER PUBLICATIONS

Armitage, J. R., "Fibre Bragg Reflectors Written At 262nm Using a Frequency Quadrupled Diode–Pumped Nd$^{3+}$:YLF Laser," Electronic Letters, vol. 29, No. 13, Jun. 24, 1993, pp. 1181–1183.

* cited by examiner

Primary Examiner—Leon Scott, Jr.
(74) Attorney, Agent, or Firm—Lee, Mann, Smith, McWilliams, Sweeney & Ohlson

(57) ABSTRACT

Instead of a single beam, two coherent beams of light are used to illuminate a phase grating in spatially separated zones for writing a Bragg reflection grating in an underlying optical (fiber) waveguide. Close proximity between phase mask and waveguide is not required. This facilitates the use of masking so that only two different diffracted orders contribute to the fringe pattern that generates the Bragg grating, thereby improving fringe contrast and reducing the deleterious spectral effects upon the reflectivity of the Bragg reflector occasioned by the presence of stitch errors in the phase grating.

6 Claims, 3 Drawing Sheets

WRITING BRAGG GRATINGS IN OPTICAL WAVEGUIDES

BACKGROUND OF THE INVENTION

This invention relates to the writing of Bragg reflection gratings in optical waveguides by exercise of the photorefractive effect in materials, such as germania doped silica. An early method of writing such gratings is described in U.S. Pat. No. 4,474,427, this method involving directing intense ultra-violet light into one end of a length of optical waveguide having a reflector at the far end so that a standing wave is set up within the waveguide. Subsequently, a lateral method of writing such a grating was disclosed in U.S. Pat. No. 4,725,110 in which a beam-splitter is used to divide a beam of ultra-violet light into two beams which are reflected in two mirrors to form and interference fringe pattern in the waveguide. This writing method is sometimes known as the holographic method. A further alternative method, sometimes known as the grating method, involves creating an equivalent fringe pattern close behind a diffraction grating illuminated with normally incident ultra-violet light, this method being described for instance in U.S. Pat. No. 5,351,321. Typically a phase grating is employed for this purpose, and the depth of the grating elements chosen for suppression of the zero order diffraction. The waveguide is located close behind the diffraction grating because it is here that the required fringe pattern, which is generated by interference between the +1 and −1 diffraction orders, is least disrupted by power diffracted into higher order modes.

An exception to this close proximity arrangement of diffraction grating and waveguide is described in the paper by J R Armitage entitled, 'Fibre Bragg Reflectors written at 262 nm Using a Frequency Quadrupled Diode-Pumped $Nd^{3+}$:YLF Laser', Electronics Letters, 24th Jun. 1993 Vol. 29, No. 13, pages 1181–3. In this instance the +1 and −1 diffraction orders are arranged to be incident upon a fused silica block. After reflection in the side walls of this block, the two beams emerge from the far end of the block and form an interference fringe pattern in the core of an optical fibre waveguide located behind the block. One advantage of this greater separation between the diffraction grating and the waveguide is that it enables a zero order beam stop to be located on the fused silica block to prevent any zero order light from reaching the fringe pattern generated by the interference between the +1 and −1 diffraction orders and thereby reducing the visibility of that fringe pattern.

SUMMARY OF THE INVENTION

It is an object of the present invention to provide a method of writing a Bragg reflection grating in an optical waveguide using a diffraction grating located at a sufficient distance from the waveguide as to make it readily possible to include aperture defining means to control the illumination of the waveguide so as to provide a high visibility fringe pattern, and at the same time to use separated portions of the diffraction grating for the generation of that fringe pattern.

Particularly in the case of the writing of long Bragg reflection gratings, such use of two separated zones of illumination of the diffraction grating has the advantage of reducing the deleterious effects in the optical performance of the resulting Bragg reflection grating caused by the presence of random stitch errors in the diffraction grating used to write that Bragg reflection grating.

According to a first aspect of the present invention there is provided a method of writing a Bragg grating in a photosensitive optical waveguide by irradiating the waveguide with an interference fringe pattern generated by the passage of electromagnetic radiation in two spatially separated zones via a diffraction grating oriented to have diffracting elements of the diffraction grating extending at an angle to the waveguide axis.

According to a second aspect of the present invention there is provided a method of writing a Bragg grating in a photosensitive optical waveguide by irradiating the waveguide with an interference fringe pattern generated by the passage of electromagnetic radiation via a diffraction grating oriented to have diffracting elements of the diffraction grating extending at an angle to the waveguide axis, wherein a beam of light is divided into two spatially separated components arranged to be incident upon the diffraction grating in two spatially separated zones, and the fringe pattern is generated by interference between one diffracted order of one of the two components and one diffracted order of the other component.

Other advantages and features of the invention will be readily apparent from the following description of the preferred embodiments, the drawings and the claims.

DESCRIPTION OF THE PREFERRED EMBODIMENTS

Before proceeding with the specific description of preferred embodiments of the present invention, further reference will be made to the prior art writing method that involves close proximity between a diffraction grating and the waveguide in which the Bragg reflection grating is to be written. This description refers to FIG. 1, and is concerned with explaining how that configuration leads to impairment of the contrast ratio in the fringe pattern in comparison with that which is attainable using the method of the present invention.

Figure 1:
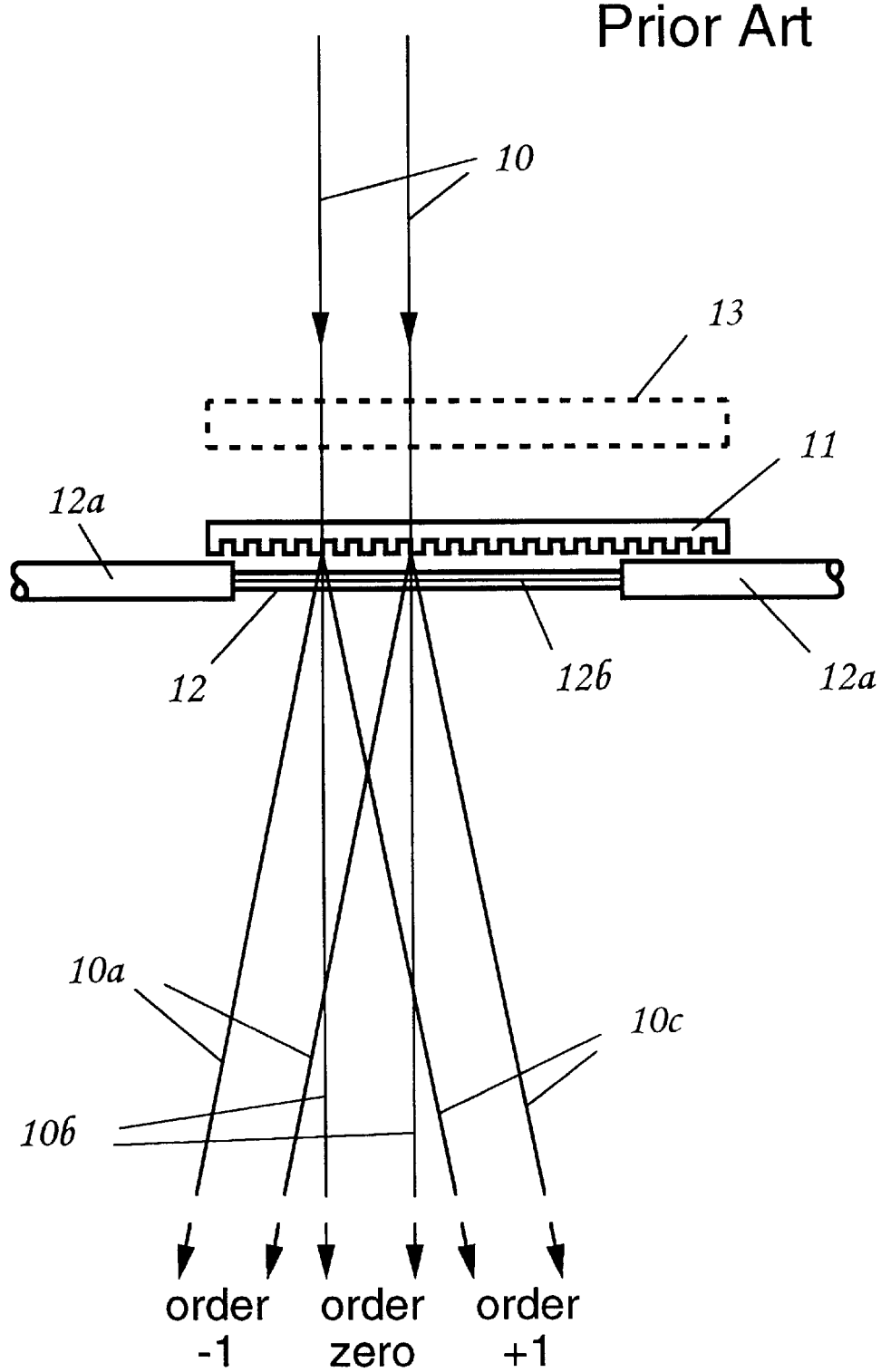
FIG. 1 is a schematic diagram of apparatus used in a prior art method of writing a Bragg reflection grating.

Referring to FIG. 1, a beam of intense ultra-violet light 10 is incident normally upon a diffraction grating 11 which is typically a phase grating whose depth is chosen to suppress the zero order diffraction of normally incident light. Close behind the phase grating is located an optical fibre waveguide 12 whose axis extends transversely with respect to the direction of extent of the grating elements of the grating 11. The waveguide 12 is typically provided with a plastics protective coating 12a, a portion of which is removed to expose the bare fibre 12 in the region in which the Bragg reflection grating is to be written. At the centre of the optical fibre is its optical core 12b, the surface of which provides the waveguiding interface of the fibre. Typically the light of beam 10 is concentrated upon this core by means of a cylindrical lens 13. When the light is incident upon the diffraction grating is divided into a number of beams of different diffraction order. In FIG. 1 just three of those beams are depicted, namely the −1 order diffraction beam 10a, the zero order diffraction beam 10b, and the +1 order diffraction beam 10c. Within the triangular area defined by the right-hand edge of the +1 order diffraction beam, the left-hand edge of the −1 order diffraction beam, and the diffraction grating itself there is complete overlap of the light of these two diffraction orders that thereby give rise to the potential of maximum fringe contrast. However this is diluted by any light propagating in the zero order (which is fringeless) if such zero order light has not been completely suppressed by the choice of appropriate profile of the grating elements of grating 11. Additionally there are regions of the fibre core 12 immediately to the left of, and immediately to the right of, the triangular region of complete overlap, where the core is exposed to light of one of the first diffraction orders, but not to that of the other. To the extent that these regions of light are devoid of the requisite fringe pattern, they create undesirable pedestals in the refractive index changes induced in the core by the photorefractive effect of the exposure to the ultra-violet light.

Figure 2:
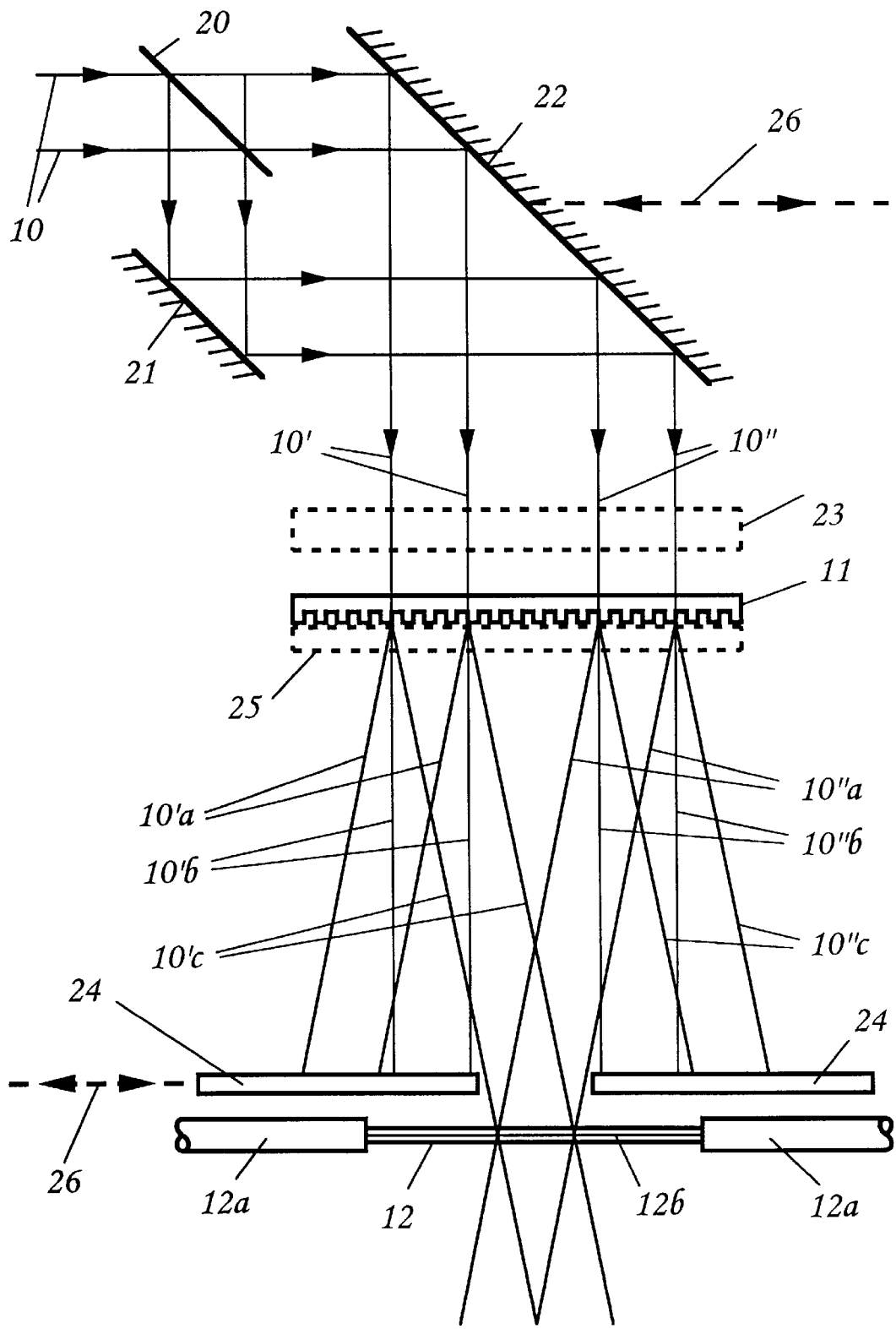
FIG. 2 is a schematic diagram of apparatus used in a method of writing a Bragg reflection grating embodying the present invention in a preferred form.

Attention is now turned to the writing of a Bragg reflective grating in the core of optical fibre waveguide using the apparatus of FIG. 2 and embodying the present invention in a preferred form. The light of beam 10 is divided into two substantially equal amplitude components 10' and 10" by means of a beam-splitter 20, these two components being incident, after reflection in mirrors 21 and 22, and optionally after passage through a cylindrical lens 23, normally upon the diffraction grating 11 in two spaced apart regions. This grating may be a uniform pitch grating or a chirped on. For the writing of a uniform pitch Bragg reflection grating it will be a uniform pitch grating. In the same way that beam 10 of FIG. 1 is divided into a number of beams of different diffraction order as the result of being incident normally upon the diffraction grating 11, the normally incident light of component beams 10' and 10" is similarly divided. In FIG. 2 also, just three of those beams are depicted for each component beam 10' and 10", namely the −1 order diffraction beams 10'$a$ and 10"$a$, the zero order diffraction beam 10'$b$ and 10"$b$, and the +1 order diffraction beams 10"$c$ and 10"$c$. A field stop 24 is placed to intercept all the diffracted orders except for diffracted beams 10'$c$ and 10"$a$, which pass through this field stop. The fibre 12 is located behind the field stop at the position where its core 12$b$ lies where there is complete overlapping of the diffracted beams 10'$c$ and 10"$a$. The cylindrical lens 23, if used, is employed to focus the light on to the core 12$b$ of the fibre 12, and so performs an equivalent function to that performed by its counterpart lens 13 of FIG. 1.

In the course of time, the profiled surface of the phase grating 1 is liable to contamination leading to impairment of its performance. It is possible to remove this contamination by a special cleaning process, but this is rather time-consuming. It may be preferred therefore, since the fibre 12 is at some distance from this grating, to provide it with a silica cover slip 25 in order to protect its profiled surface from contamination, the exposed surface of the cover slip being capable of being cleaned much more readily and quickly.

The apparatus of FIG. 2 may be used for the writing of Bragg reflection gratings on a static basis, in which case further masking (not shown) may be employed for apodisation of the extremities of the written grating. Alternatively, particularly for the writing of longer Bragg reflection gratings, the apparatus may be used for writing in a scanning mode, in which case there is ganged movement of the mirror 22 and the field stop 24 in the direction of axial extent of the fibre 12, such ganged movement being indicated by arrows 26.

One of the problems liable to be encountered in the writing of long Bragg reflection gratings is the degradation of spectral performance introduced by the presence of stitch errors in the spacing of the diffracting elements of the diffraction grating employed to write that Bragg grating. These stitch errors are particularly liable to arise when the diffracting elements of the diffraction grating are themselves written in batches on a step-and-repeat basis for instance using E-beam lithographic techniques. Imperfections in the stepping process are liable to produce 'phase errors' of random magnitude between nearest neighbour diffraction elements of adjacent batches of elements. With the close proximity arrangement of diffraction grating and optical waveguide of FIG. 1, such phase errors are translated with little modification from the diffraction grating to the Bragg reflection grating because relatively few diffraction elements of the diffraction grating contribute significantly to the writing of any individual element of the Bragg reflection grating. This contrasts with the situation pertaining in the case of the spaced arrangement of FIG. 2. In particular it will be appreciated that, because the magnitudes of the individual phase errors are random, there is liable to be no correlation between a phase error present in that part of the diffraction grating illuminated by beam 10' and one present in that part illuminated by beam 10". This means that stitch errors in present in the diffraction grating 11 have less deleterious effect upon the spectral performance of Bragg reflectors written using the apparatus of FIG. 2 than upon those written using the apparatus of FIG. 1.

Figure 3:
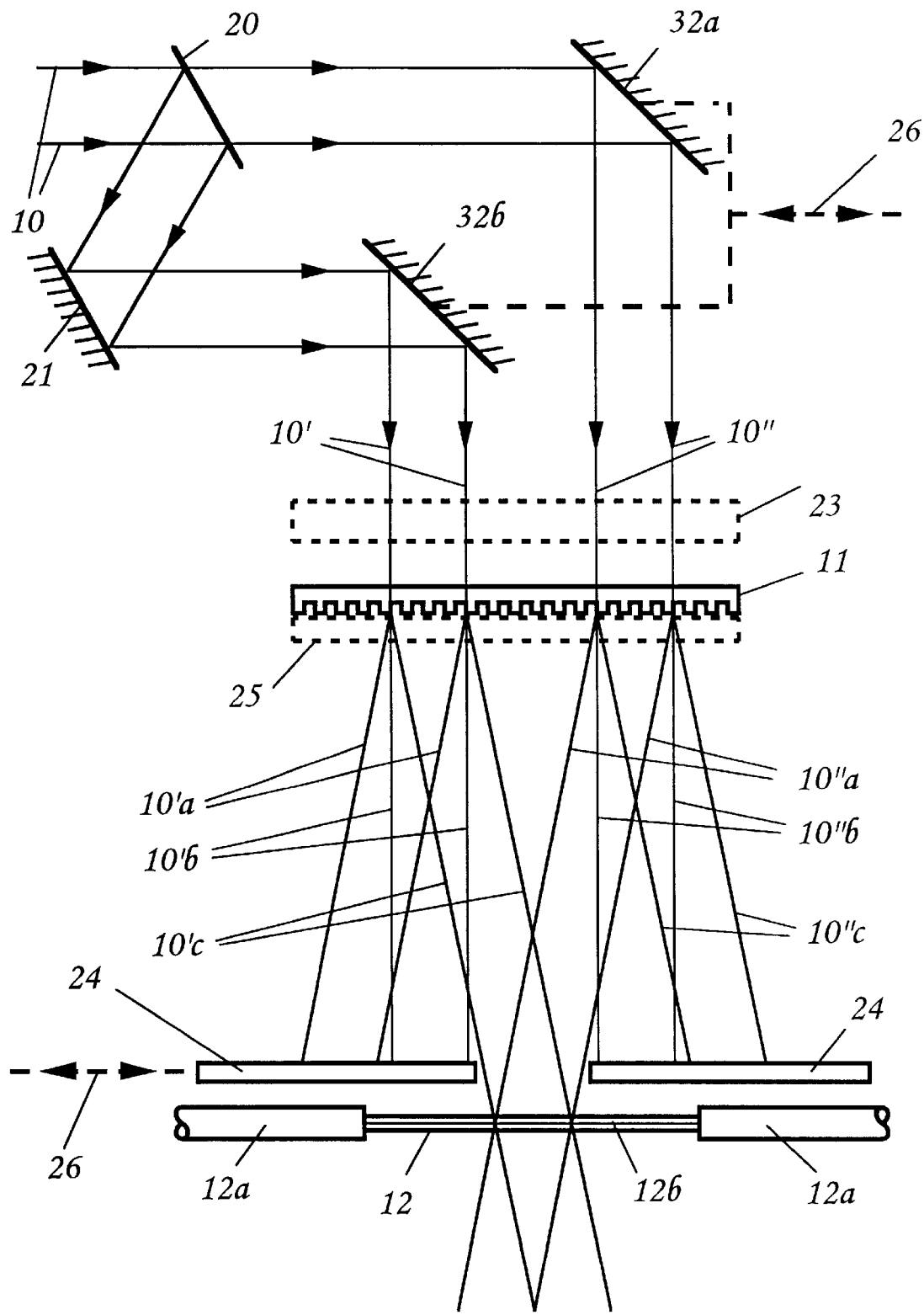
FIG. 3 is a schematic diagram of an alternative form of apparatus used in a method of writing a Bragg reflection grating embodying the present invention in a preferred form.

It may be noted that the particular arrangement of beam-splitter 20, and mirrors 21 and 22 of FIG. 2 provides a noticeably unequal optical path difference in respect of the two pathways from the beam-splitter to the fibre core 12$b$. This can be a problem if the source of ultra-violet light providing beam 10 has a short optical coherence length. FIG. 3 shows a modified arrangement in which, in order to equalise the optical path length, the single mirror 22 has been replaced by a pair of mirrors 32$a$ and 32$b$ and the beam-splitter 20 and mirror 21 have been reoriented. In all other respects the components of the apparatus of FIG. 3 are in essence identical with their counterparts in the apparatus of FIG. 2.

What is claimed is:

1. A method of writing a Bragg grating in a photosensitive optical waveguide by irradiating the waveguide with an interference fringe pattern generated by the passage of electromagnetic radiation in two spatially separated zones through a diffraction grating oriented to have diffracting elements of the diffraction grating extending at an angle to the waveguide axis.

2. A method as claimed in claim 1, wherein a phase grating is employed as the diffraction grating.

3. A method as claimed in claim 1, wherein a chirped diffraction grating is employed to write the Bragg reflection grating, which Bragg reflection grating is a chirped grating.

4. A method of writing a Bragg grating in a photosensitive optical waveguide by irradiating the waveguide with an interference fringe pattern generated by the passage of electromagnetic radiation via a diffraction grating oriented to have diffracting elements of the diffraction grating extending at an angle to the waveguide axis, wherein a beam of light is divided into two spatially separated components arranged to be incident upon the diffraction grating in two spatially separated zones, and the fringe pattern is generated by interference between one diffracted order of one of the two components and one diffracted order of the other component.

5. A method as claimed in claim 4, wherein a phase grating is employed as the diffraction grating.

6. A method as claimed in claim 4, wherein a chirped diffraction grating is employed to write the Bragg reflection grating, which Bragg reflection grating is a chirped grating.

* * * * *